(12) United States Patent
Yoo (10) Patent No.: US 11,629,919 B2
(45) Date of Patent: Apr. 18, 2023

(54) METHOD OF MANUFACTURING COOLING DEVICE USING HEAT PIPE

(71) Applicant: MH TECHNOLOGIES INC., Incheon (KR)

(72) Inventor: Jin-Ho Yoo, Seoul (KR)

(73) Assignee: MH TECHNOLOGIES INC., Incheon (KR)

( * ) Notice: Subject to any disclaimer, the term of this patent is extended or adjusted under 35 U.S.C. 154(b) by 246 days.

(21) Appl. No.: 16/951,261

(22) Filed: Nov. 18, 2020

(65) Prior Publication Data

US 2021/0148644 A1    May 20, 2021

(30) Foreign Application Priority Data

Nov. 19, 2019  (KR) ........................ 10-2019-0148400

(51) Int. Cl.
  *F28D 15/02*    (2006.01)

(52) U.S. Cl.
  CPC ...... *F28D 15/0283* (2013.01); *B23P 2700/09* (2013.01); *Y10T 29/49353* (2015.01)

(58) Field of Classification Search
  CPC .............. B22D 17/005; B22D 19/0072; B22D 19/0081; B23P 2700/09; Y10T 29/49353; F28D 15/0275; F28D 15/0283
  See application file for complete search history.

(56) References Cited

U.S. PATENT DOCUMENTS

| 6,827,136 | B2* | 12/2004 | Liu | ...................... F28D 15/0275 |
| | | | | 165/185 |
| 7,047,639 | B1* | 5/2006 | Sheen | ....................... F28F 1/12 |
| | | | | 29/890.047 |
| 11,305,337 | B2* | 4/2022 | Lee | ........................ B22D 17/00 |
| 2015/0013928 | A1 | 1/2015 | Lin | |

FOREIGN PATENT DOCUMENTS

| CN | 110248749 A | 9/2019 |
| JP | 2003-329381 A | 11/2003 |
| JP | 3181468 U | 2/2013 |
| KR | 10-2008-0032853 A | 4/2008 |
| KR | 10-2015-0011591 A | 2/2015 |
| KR | 10-2017-0118309 A | 10/2017 |
| KR | 10-2017-0128817 A | 11/2017 |
| WO | WO 2017/179962 A1 | 10/2017 |
| WO | WO 2019/045512 A1 | 3/2019 |

* cited by examiner

*Primary Examiner* — Jason L Vaughan
(74) *Attorney, Agent, or Firm* — Birch, Stewart, Kolasch & Birch, LLP (57) ABSTRACT

The present invention relates to a method of manufacturing a cooling device using a heat pipe in which, using casting, the heat pipe is embedded inside a housing, and the method includes a filling step in which a predetermined support member is filled inside a pipe to prevent deformation of the pipe by a pressure of a melt being injected into a cavity of a mold that is closeable, a pipe seating step in which the pipe filled with the predetermined support member is seated in the cavity, a melt injecting step in which the melt is injected into the cavity to surround the pipe, a cooling and with- (Continued)

drawing step in which the injected melt is cooled and a molded product is withdrawn, an injecting step in which a working fluid is injected into the pipe through an injection end, and a finishing step in which, after the injecting step, the pipe is sealed.

7 Claims, 6 Drawing Sheets

METHOD OF MANUFACTURING COOLING DEVICE USING HEAT PIPE

CROSS REFERENCE TO RELATED APPLICATIONS

This non-provisional application claims the benefit under 35 U.S.C. § 119(a) to Patent Application No. 10-2019-0148400, filed in the Republic of Korea on Nov. 19, 2019, which is hereby expressly incorporated by reference into the present application.

BACKGROUND

1. Technical Field

The present invention relates to a method of manufacturing a cooling device using a heat pipe, and more particularly, to a method of manufacturing a cooling device using a heat pipe in which, using casting, the heat pipe is embedded inside a housing.

2. Description of Related Art

Heat pipes have thermal conductivity that is tens to hundreds of times higher than that of high thermal conductivity metals such as silver, copper, and aluminum. Heat pipes are heat transfer devices that have a very wide range of applications and are usefully applied in various fields such as when attempting to cool a heat generation part in a specific location such as a central processing unit (CPU) of a computer, attempting to recover heat from exhaust gas, or attempting to collect geothermal or solar heat.

Also, heat pipes are made of airtight solids such as metals such as stainless steel, copper, and aluminum and are in the form of a tube or the like and have a closed space formed therein to hold a working fluid. Therefore, when heat is applied at one side of a housing, the working fluid is evaporated in an inner space of the corresponding heating part, and the evaporated vapor quickly moves to the other side of the housing, at which heat is not applied, and is condensed such that latent heat of the fluid is transferred from the heating part (evaporation part) to a condensation part. The condensed liquid returns to the heating part by a capillary force due to a wick structure provided inside the housing. Then, as the above heat transfer cycle is repeated endlessly, the heat of the heating part is continuously transferred to the condensation part.

The heat pipe operating as described above may be embedded in a metal housing to cool an object that needs cooling. To this end, conventionally, a method has been used in which upper and lower products having a groove formed in an adhesive surface are formed and then adhered. However, there is a problem in that it is difficult to manufacture a sturdy product due to a rigidity problem or the like of an adhesive portion.

A method has been developed thereafter in which a hollow molded product is manufactured using casting and the hollow inside the molded product is used as a heat pipe. That is, a long hollow tube is seated in a mold for product manufacturing, the mold is closed, and then a molten metal in a liquid state due to the melting of a melting material, that is, a melt, is supplied into the mold to mold a product.

However, even in this case, there is a problem in that, because there is a limit to the rigidity of the long tube, the hollow may be deformed or destroyed during casting. Therefore, technology to fill a specific material inside the long tube having a hollow formed therein and then remove the specific material after the product is molded is used in some cases.

However, conventionally, there has been a problem in that, after a hollow product is molded, it is not easy to perform a task of removing a material for forming the hollow. In order to address this, a method of manufacturing a hollow product has been disclosed in Korean Patent Laid-Open Publication No. 10-2017-0118309.

However, when manufacturing the hollow product, there are problems in that a pipe melts and is damaged by a high temperature of a melting solution, that is, a melt, and an injection pressure causes a support member to generate indentations on an inner wall of the pipe.

SUMMARY

1. Technical Problem

An embodiment of the present invention provides a method of manufacturing a cooling device using a heat pipe that allows the prevention of a case where a pipe is damaged by a high temperature of a melting solution during casting.

An embodiment of the present invention provides a method of manufacturing a cooling device using a heat pipe that allows the prevention of a case where an injection pressure of a melting solution causes a support member, which is filled in a pipe, to generate indentations on an inner wall of the pipe.

2. Solution to Problem

The present invention provides a method of manufacturing a cooling device using a heat pipe, the method including a filling step in which a predetermined support member is filled inside a pipe to prevent deformation of the pipe by a pressure of a melt being injected into a cavity of a mold that is closeable, a pipe seating step in which the pipe filled with the predetermined support member is seated in the cavity, a melt injecting step in which the melt is injected into the cavity to surround the pipe, a cooling and withdrawing step in which the injected melt is cooled and a molded product formed by the melt being cooled is withdrawn, an injecting step in which a working fluid is injected into the pipe through an injection end formed at one end of the pipe, and a finishing step in which, after the injecting step, the pipe is sealed.

The method may further include, between the cooling and withdrawing step and the injecting step, a preprocessing step in which foreign matter is removed in advance from an inner side surface of the pipe.

The method may further include, between the preprocessing step and the injecting step, a tube blocking step in which the other end disposed opposite the injection end is sealed.

The method may further include, between the tube blocking step and the injecting step, an airtightness testing step in which airtightness of the pipe is tested before injecting the working fluid thereinto.

The pipe may include a first pipe that is meltable by the melt and a second pipe that is disposed inside the first pipe and has a melting point higher than a melting point of the melt.

The pipe may include a first pipe that is meltable by the melt and a second pipe that has a hardness higher than a hardness of the support member.

3. Advantageous Effects

According to an embodiment of the present invention, there are the following effects.

First, according to an embodiment of the present invention, there is an effect of preventing a case where a pipe is damaged by a high temperature of a melting solution during casting.

Second, according to an embodiment of the present invention, there is an effect of preventing a case where an injection pressure of a melting solution causes a support member, which is filled in a pipe, to generate an indentation on an inner wall of the pipe.

DETAILED DESCRIPTION OF EMBODIMENTS

The embodiments described below are illustratively shown to aid understanding of the invention, and it should be understood that the present invention may be modified and embodied in various ways, differently from the embodiments described herein. However, in describing the present invention, when it is determined that detailed description of a related known function or element may unnecessarily obscure the gist of the present invention, the detailed description and detailed illustration thereof will be omitted. In addition, to aid understanding of the invention, the accompanying drawings may have not been drawn to scale, and dimensions of some elements may have been exaggerated.

Terms such as first and second used herein may be used to describe various elements, but the elements should not be limited by the terms. The terms are only used for the purpose of distinguishing one element from another element.

Also, the terms used herein are only used to describe specific embodiments and are not intended to limit the scope of the present invention. A singular expression includes a plural expression unless the context clearly indicates otherwise. In the application, terms such as "include," "have," or "consist of" should be understood as specifying that features, numbers, steps, operations, elements, components, or combinations thereof are present and not as precluding the possibility of the presence or addition of one or more other features, numbers, steps, operations, elements, components, or combinations thereof in advance.

Figure 1:
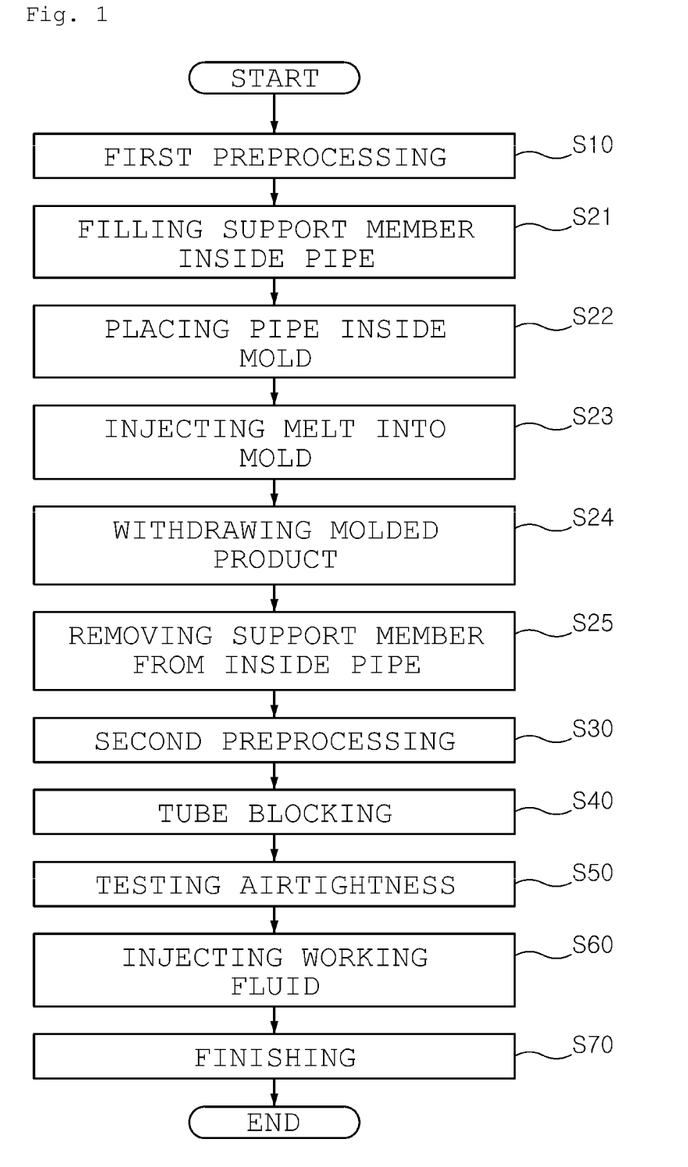
FIG. 1 is a flowchart showing steps of a method of manufacturing a cooling device using a heat pipe.

FIG. 1 is a flowchart showing steps of a method of manufacturing a cooling device using a heat pipe according to an embodiment of the present invention. Referring to FIG. 1, a method of manufacturing a cooling device using a heat pipe according to an embodiment of the present invention includes a first preprocessing step (S10) in which foreign matter is removed from a pipe 30 having a hollow formed therein, a filling step (S21) in which a predetermined support member is filled inside the pipe 30 to prevent deformation of the pipe 30 by a pressure of a melt being injected into a cavity of a mold that is closeable, a pipe seating step (S22) in which the pipe 30 filled with the predetermined support member is seated in the cavity, a melt injecting step (S23) in which the melt is injected into the cavity of the mold to surround the pipe 30, a cooling and withdrawing step (S24) in which the injected melt is cooled and a molded product is withdrawn, a step (S25) in which the support member is removed from inside the pipe 30 after the molded product having a hollow formed therein is molded due to the pipe 30, a second preprocessing step (S30) in which foreign matter is removed in advance from an inner side surface of the pipe 30 before injecting a working fluid thereinto, a tube blocking step (S40) in which, after the second preprocessing step, the other end disposed opposite an injection end through which the working fluid is injected is sealed, an airtightness testing step (S50) in which, after the tube blocking step, airtightness of the pipe 30 is tested before injecting the working fluid thereinto, an injecting step (S60) in which the working fluid is injected into the pipe 30 through the injection end, and a finishing step (S70) in which, after the injecting step, the pipe 30 is sealed.

Figure 2:
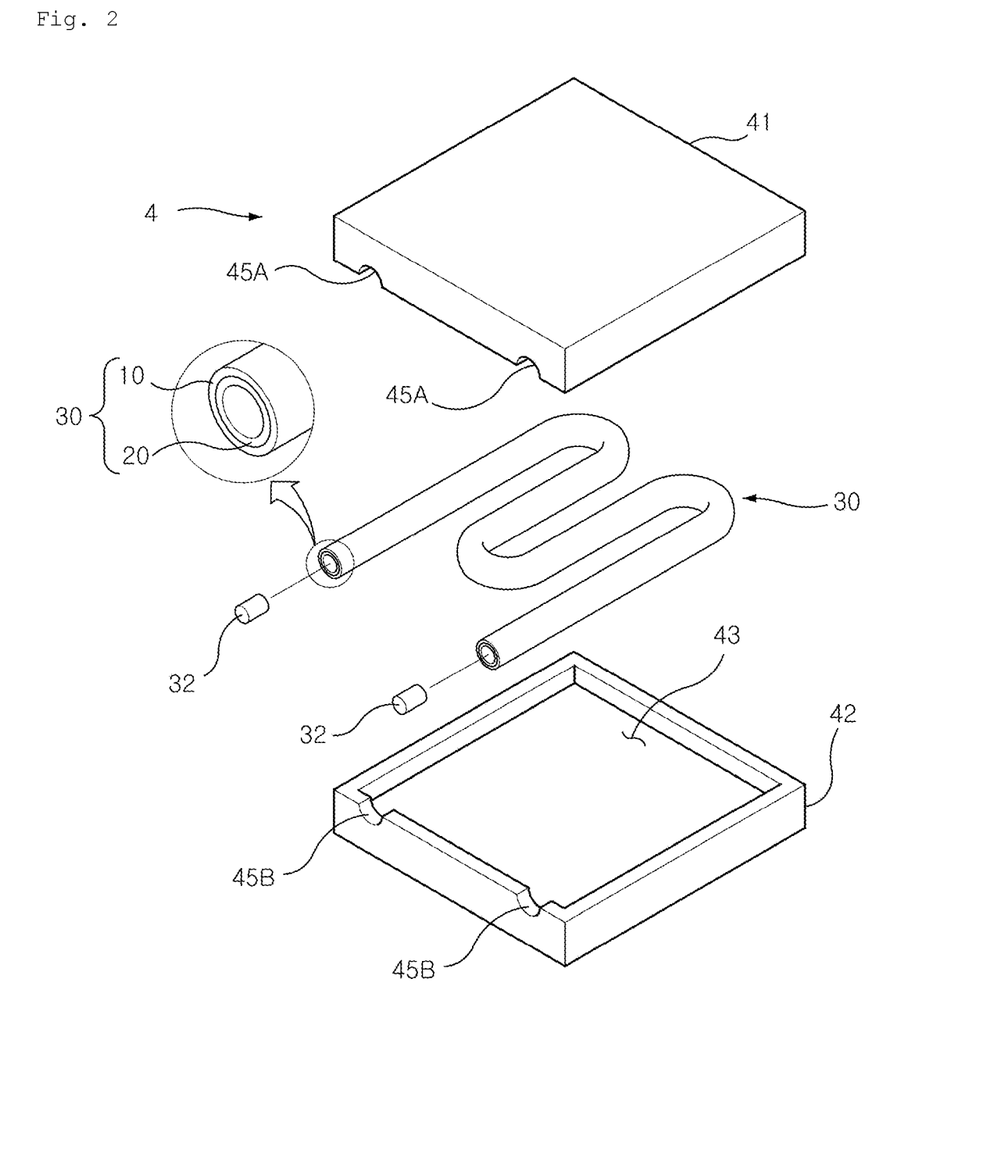
FIG. 2 is an exploded perspective view of a mold device for manufacturing a hollow molded product according to an embodiment of the present invention.
Figure 3:
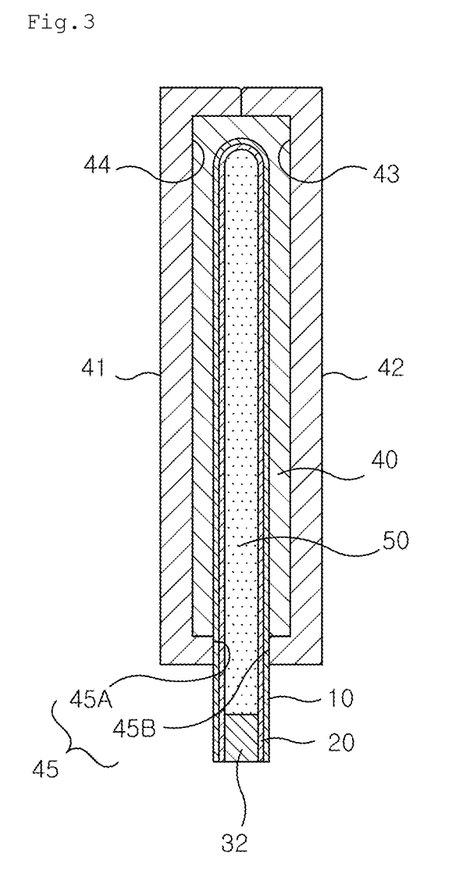
FIG. 3 is a side cross-sectional view illustrating a state in which a pipe filled with a support member, which is mentioned in FIG. 1, is seated in the mold device for manufacturing a hollow molded product.

Hereinafter, the method of manufacturing a cooling device using a heat pipe according to an embodiment of the present invention will be described with reference to FIGS. 2 and 3. FIG. 2 is an exploded perspective view of a mold device for manufacturing a hollow molded product according to an embodiment of the present invention, and FIG. 3 is a side cross-sectional view illustrating a state in which a pipe filled with a support member, which is mentioned in FIG. 1, is seated in the mold device for manufacturing a hollow molded product.

The hollow molded product described below includes a molded product having a hollow formed therein by use of a mold device using a pipe having a double structure made of bimetal. Also, the pipe having a double structure made of bimetal may be used in the mold device for manufacturing a hollow molded product, and a method of manufacturing the hollow molded product is a method of manufacturing a molded product having a hollow formed therein that is performed using the mold device.

The mold device according to an embodiment of the present invention is a device for manufacturing a molded product having a hollow formed therein. The hollow molded product, which is the molded product having a hollow formed therein, is manufactured by opening a mold of the mold device, inputting a hollow pipe into a cavity formed inside the mold, closing the mold, and then injecting a melt. The hollow formed inside the molded product is formed as the melt injected into the cavity is cooled without being injected into the hollow inside the pipe 30.

The mold device includes a mold 4 including a first mold 41 and a second mold 42, and the pipe 30 disposed between the first mold 41 and the second mold 42.

The first mold 41 has a first cavity 44 formed therein and a first through-hole 45A disposed at one side to allow the pipe 30 to be fitted therein. The first through-hole 45A allows the first cavity 44 to communicate with the outside.

The second mold 42 has a second cavity 43 formed therein, and the second cavity 43 forms a single cavity together with the first cavity 44 when the second mold 42 and the first mold 41 are closed. The second mold 42 has a second through-hole 45B disposed at one side to allow the pipe 30 to be fitted therein. The second through-hole 45B allows the second cavity 43 to communicate with the outside. Also, the second through-hole 45B forms a single through-hole 45, in which the pipe 30 is disposed, together with the first through-hole 45A.

Both end portions of the pipe 30 are disposed outside the cavity, and at each end portion, a hole is formed to allow the hollow of the pipe 30 to communicate with the outside. A hole disposed at one of the both end portions may serve as an inlet through which a fluid or a support member, which will be described below, is introduced, and the hole disposed at the other end portion may serve as an outlet through which the fluid or support member is discharged. The holes may be opened and closed by a cap 32.

Figure 5:
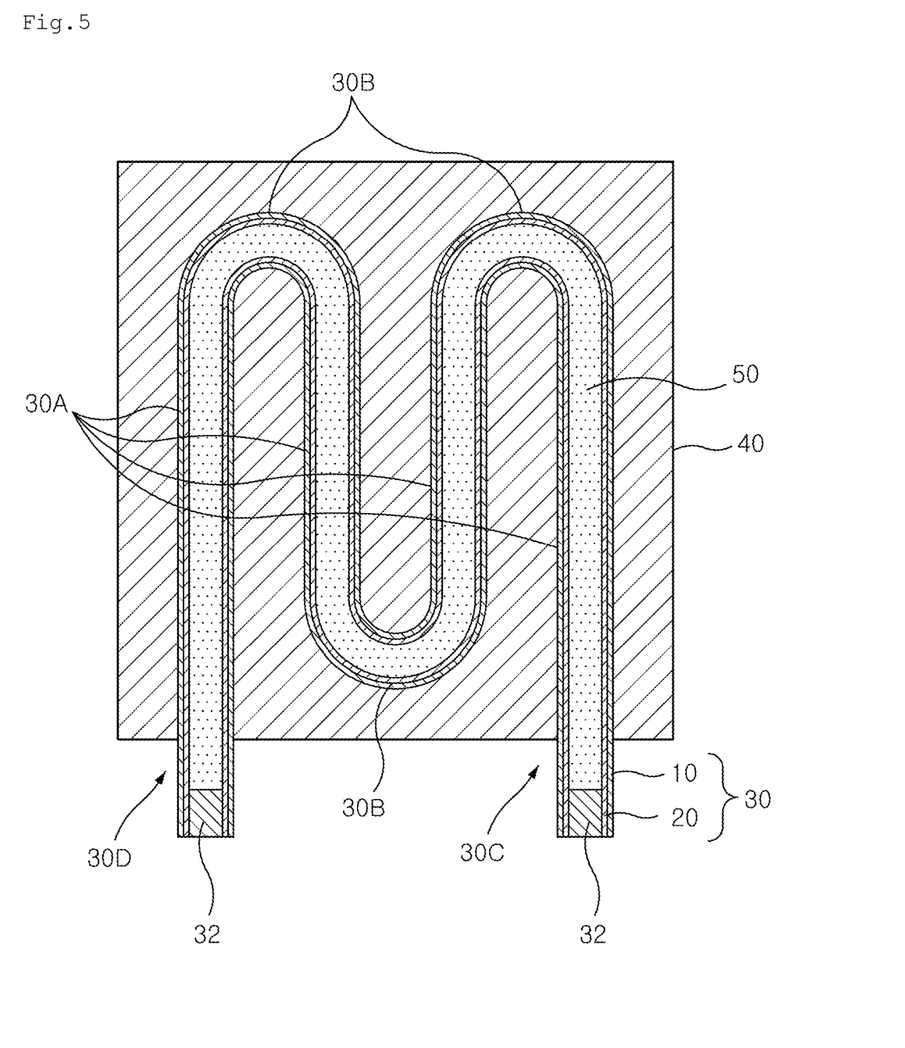
FIG. 5 is a cross-sectional view of the molded product having the hollow formed therein, which is illustrated in FIG. 4, and shows a state in which a support member is filled in the hollow.
Figure 6:
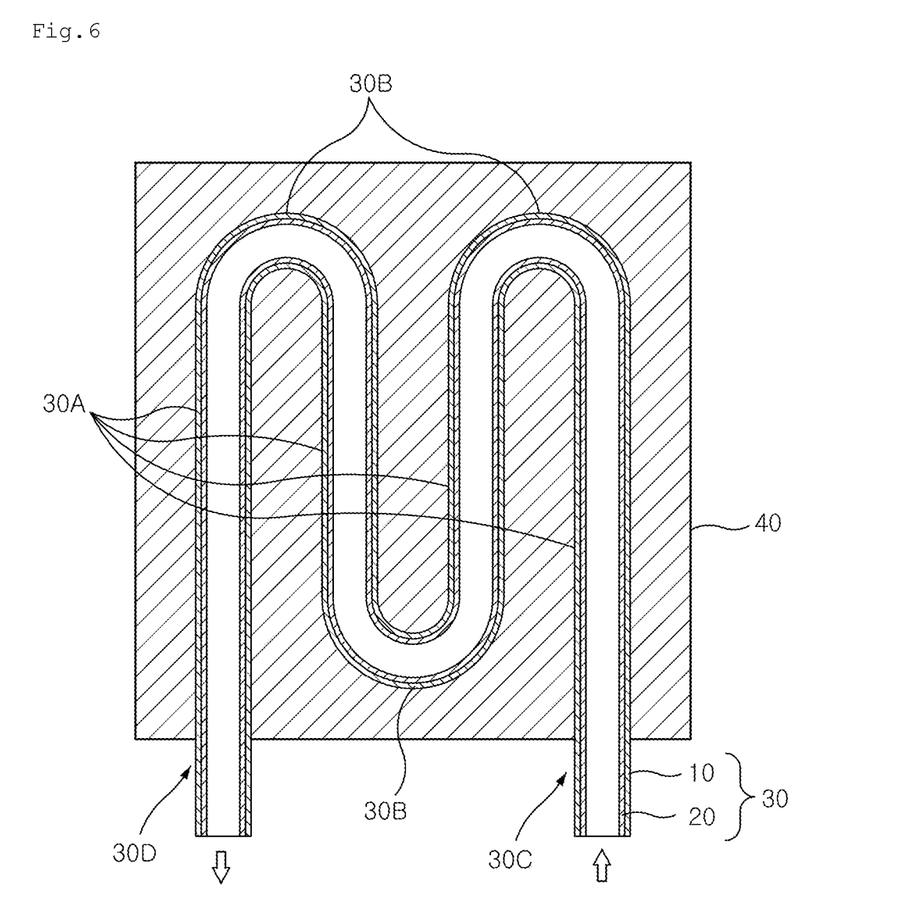
FIG. 6 is a cross-sectional view of the molded product having the hollow formed therein, which is illustrated in FIG. 4, and shows a state in which the support member is removed from the hollow.

Also, as illustrated in FIGS. 2, 5, and 6, the pipe 30 includes parallel portions 30A disposed inside the cavity to be parallel to each other, bent portions 30B configured to allow the parallel portions 30A to communicate with each other, and outer protrusions 30C and 30D which are connected to the parallel portions 30A and protrude to the outside of a molded product 40.

The parallel portions 30A and bent portions 30B form a single path and communicate with the outside through the holes formed at both end portions of the pipe 30. Accordingly, the pipe 30 forms a path that continues in a zigzag manner. However, the pipe 30 is not limited to having a zigzag shape and may have various other shapes such as a straight shape.

The pipe 30 has a double structure made of bimetal and includes a first pipe 10 which forms an outer layer of the double structure and a second pipe 20 which forms an inner layer of the double structure and is disposed inside the first pipe 10. An inner circumferential surface of the first pipe 10 and an outer circumferential surface of the second pipe 20 are joined.

The first pipe 10 may be made of, for example, an aluminum (Al) material. A melting material used for a melting solution, that is, a melt, injected into the cavity may be the same material as the material of which the first pipe 10 is made. For example, the melting material may be Al. Therefore, when a high-temperature melt is injected, the first pipe 10 may melt partially or entirely. In this case, a thickness of the first pipe 10 may be preset so that only a portion of an outer side of the first pipe 10 melts, instead of the entire first pipe 10 melting, due to injection of the melt.

In order to prevent indentations due to a support member 50, which will be described below, the second pipe 20 has a hardness higher than or equal to a hardness of the support member 50. Generally, an indentation is generated when, in a case in which a high-temperature melt is injected into a cavity, the high temperature causes a pipe to have softness, and simultaneously, an injection pressure due to the melt is applied to the pipe and an inner circumferential surface of the pipe presses a support member inside the pipe.

The second pipe 20 may be made of a material of which a melting point and hardness are higher than a melting point and hardness of each of the material of the first pipe 10 and the melting material of the melt. In this case, the first pipe 10 is made of a material having a hardness lower than or equal to the hardness of the support member 50. Many of the materials with high hardness and melting points are expensive, and many of the materials with low hardness and melting points are cheap. When the first pipe 10 is made of a material which is the same as the melting material but has a low melting point and low hardness and thus is relatively cheap, and the second pipe 20 is made of a material which is relatively expensive and has relatively higher melting point and hardness, it is possible to obtain the pipe 30 having a desired performance while manufacturing costs are lowered.

The second pipe 20 may be made of, for example, a copper (Cu) material. Since the melting point of Cu is higher than that of Al, the second pipe 20 is not damaged even when the melt, of which the melting material is Al, is injected. In the case in which the second pipe 20 is made of the Cu material, the hardness of the second pipe 20 is higher than the hardness of the support member 50. Therefore, in a state in which an inner circumferential surface of the second pipe 20 and the support member 50 are pressed against each other, an indentation on the inner circumferential surface of the second pipe 20 by an external pressure is prevented.

Here, the external pressure refers to an injection pressure applied to an outer portion of the pipe 30 when the melt is injected. When the melt injection pressure is applied to an outer circumferential surface of the first pipe 10, the first pipe 10 and the second pipe 20 are slightly compressed, and the inner circumferential surface of the second pipe 20 presses the support member 50. Since the hardness of the second pipe 20 is higher than the hardness of the support member 50, an indentation is not generated on the inner circumferential surface of the second pipe 20.

Further, since the second pipe 20 does not come in direct contact with the melt, the degree of softening of the second pipe 20 due to the high-temperature melt is low, which is advantageous in terms of preventing indentations. This is because the second pipe 20, which is surrounded by the first pipe 10 coming in direct contact with the high-temperature melt, is heated to a lower temperature than the first pipe 10 and may maintain its original hardness to a considerable level.

Meanwhile, when the melt is injected into the cavity, deformation of the pipe 30 may occur due to the pressure of the melt. Therefore, the support member 50 is filled inside the pipe 30 to prevent deformation of the pipe 30 by the pressure of the melt.

In relation thereto, as described above, the method of manufacturing a cooling device using a heat pipe according to an embodiment of the present invention includes filling the support member 50 into the pipe 30 (S21), blocking an inlet of the pipe 30 filled with the support member 50 with the cap 32 and placing the pipe 30 in the cavity inside the mold 4 for injection of a melt (e.g., an Al solution) (S22), injecting the melt into the cavity of the mold 4 (S23), and, after a molded product having a hollow formed therein is molded due to the pipe 30, removing the support member 50 from inside the pipe 30 (S25).

Figure 4:
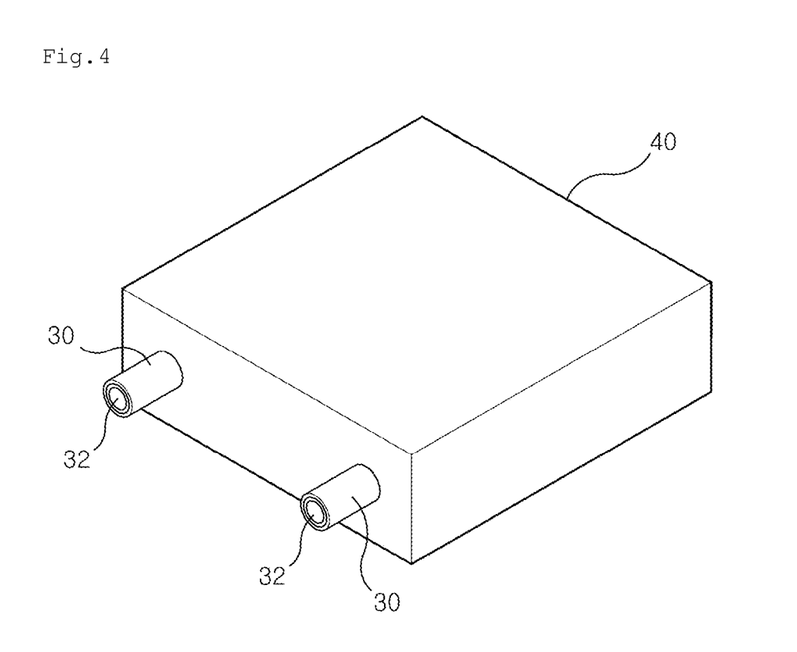
FIG. 4 is a perspective view illustrating a molded product having a hollow formed therein that is manufactured using the mold device for manufacturing a hollow molded product, which is mentioned in FIG. 1.

The support member 50 may be a water-soluble material. In this case, as illustrated in FIGS. 4 to 6, when water is injected into the pipe 30 after the molded product 40 is manufactured, the support member 50 inside the pipe 30 may be dissolved and emptied from the pipe 30 by the water, and the pipe 30 from which the support member 50 is emptied may be embedded inside the molded product 40 so that a product having a hollow formed therein is molded.

The water-soluble material may consist of salt. The salt may be dissolved and removed by the water introduced into the pipe 30. The melting point of salt is higher than the melting point of Al. When the pipe 30 is made of Al and the melting material is also Al, while a portion of the pipe 30 melts and is integrally molded with the melt, the shape of salt may remain the same. Therefore, the pipe 30 may withstand the melt injection pressure. The pipe 30 is prevented from being crushed by the melt injection pressure. The melt and the pipe 30 may be integrated into one body in a state in which the pipe 30 is supported by the salt, and simultaneously, a molded product having a hollow formed therein may be molded due to the pipe 30.

After the melt is injected in the state in which the pipe 30 is supported by the salt, and the molded product 40 is molded, the cap 32 coupled to both end portions of the pipe 30 may be removed, and water may be injected into the pipe 30 to dissolve the salt. In this way, the salt may be removed from inside the pipe 30.

Hereinafter, in a method of manufacturing the molded product 40 having a hollow formed therein according to the present invention, after molding of the molded product 40 is completed, the following method is used to effectively remove a soluble material remaining inside the pipe 30 embedded in the product.

Salt is filled inside the pipe 30, and then, in a state in which the pipe 30 is input into the cavity of the mold 4, the melt is injected with a predetermined pressure into the cavity of the mold 4 to mold a preliminary molded product 40 in which the pipe 30 and the melt are integrated into one body. In a state in which the first mold 41 and the second mold 42 are closed, the cavity for molding the molded product 40 is formed inside the mold 4.

Salt is filled inside the pipe 30, and, in the state in which the pipe 30 is input into the cavity of the mold 4 for product molding, the melt is injected into the cavity of the mold 4 to form an exterior of a product. Then, when water having a predetermined pressure is injected into the pipe 30 in a direction indicated by arrows illustrated in FIG. 5, since the water dissolves the salt, the salt is removed. When the salt is removed, due to the empty pipe 30 embedded in the product, it is possible to mold the molded product 40 having a hollow formed therein.

Meanwhile, according to another embodiment of the present invention, the support member 50 may be made of a particulate material having a strength that allows the pipe 30 to withstand the melt injection pressure, and the support member 50 may be removed from the pipe 30 after a hollow is formed inside a product due to the pipe 30. Here, the particulate material may be a material, such as a ceramic, sand, balls (metal balls, in other words, steel balls), of which a melting point is higher than the high temperature of the melt and the melting point of the pipe 30.

As described above, in the case in which the pipe 30 is made of Al and the melt is also a high-temperature molten Al solution, while a portion of the pipe 30 melts and is integrally molded with the melt due to the melting point of the particulate support member 50 (particulate material), which is made of a ceramic, steel balls, or the like, being higher than the melting point of Al, the shape of the particulate support member 50 remains the same and thus the particulate support member 50 allows the pipe 30 to withstand the melt injection pressure. The pipe 30 is prevented from being crushed by the melt injection pressure. The melt and the pipe 30 may be integrated into one body in the state in which the pipe 30 is supported by the support member 50, and simultaneously, the molded product 40 having a hollow formed therein may be molded due to the pipe 30.

After the melt is injected to mold a molded product in the state in which the pipe 30 is supported by the particulate support member 50, the cap 32 coupled to the inlet of the pipe 30 may be removed, and then, air may be blown into one end portion of the pipe 30 in a direction indicated by arrows illustrated in FIG. 6 so that the particulate support member 50 is eluted and removed through the other end portion of the pipe 30. Pressurized water having a predetermined pressure may be injected into the pipe 30 as necessary so that the particulate support member 50 is removed by the water injection pressure.

Meanwhile, the cap 32 coupled to the pipe 30 is disposed outside the cavity. The pipe 30 is input into the cavity of the mold 4, and then the melt is injected into the cavity of the mold 4 to mold a molded product. Then, since the cap 32 is exposed to the outside of the molded product, the cap 32 may be removed from the pipe 30. After the cap 32 is removed from the pipe 30, in the case in which salt is filled inside the pipe 30, water is injected to dissolve and remove the salt, and in the case in which the particulate support member such as a ceramic, sand, or steel balls is filled inside the pipe 30, the cap 32 is removed and air is blown into one end portion of the pipe 30 so that the particulate material is eluted and removed through the other end portion of the pipe 30.

Then, the second preprocessing step (S30) in which foreign matter is removed in advance from an inner side surface of the pipe before injecting a working fluid thereinto, the tube blocking step (S40) in which, after the second preprocessing step, the other end disposed opposite the injection end through which the working fluid is injected is sealed, the airtightness testing step (S50) in which, after the tube blocking step, airtightness of the pipe is tested before injecting the working fluid thereinto, the injecting step (S60) in which the working fluid is injected into the pipe through the injection end, and the finishing step (S70) in which, after the injecting step, the pipe is sealed are performed.

The present invention has been described above through limited embodiments and drawings, but the present invention is not limited thereto, and, of course, those of ordinary skill in the art to which the present invention pertains may make various modifications and changes within the technical idea of the present invention and the scope equivalent to the claims below.

DESCRIPTION OF SYMBOLS

4: mold
10: first pipe
20: second pipe
30: pipe
32: cap
41: first mold
42: second mold
45: through-hole

The invention claimed is:

1. A method of manufacturing a cooling device using a heat pipe, the method comprising:
   a filling step in which a predetermined support member is filled inside a pipe to prevent deformation of the pipe by a pressure of a melt being injected into a cavity of a mold that is closeable;
   a pipe seating step in which the pipe filled with the predetermined support member is seated in the cavity;
   a melt injecting step in which the melt is injected into the cavity to surround the pipe;
   a cooling and withdrawing step in which the injected melt is cooled and a molded product formed by the melt being cooled is withdrawn;
   an injecting step in which a working fluid is injected into the pipe through an injection end formed at one end of the pipe;

a finishing step in which, after the injecting step, the pipe is sealed;

between the cooling and withdrawing step and the injecting step, a preprocessing step in which foreign matter is removed in advance from an inner side surface of the pipe;

between the preprocessing step and the injecting step, a tube blocking step in which an opposite end disposed opposite the injection end is sealed; and between the tube blocking step and the injecting step, an airtightness testing step in which airtightness of the pipe is tested before injecting the working fluid thereinto.

2. A method of manufacturing a cooling device using a heat pipe, the method comprising:

a filling step in which a predetermined support member is filled inside a pipe to prevent deformation of the pipe by a pressure of a melt being injected into a cavity of a mold that is closeable;

a pipe seating step in which the pipe filled with the predetermined support member is seated in the cavity;

a melt injecting step in which the melt is injected into the cavity to surround the pipe;

a cooling and withdrawing step in which the injected melt is cooled and a molded product formed by the melt being cooled is withdrawn;

an injecting step in which a working fluid is injected into the pipe through an injection end formed at one end of the pipe; and a finishing step in which, after the injecting step, the pipe is sealed, wherein the pipe includes:
a first pipe that is meltable by the melt; and
a second pipe that is disposed inside the first pipe and has a melting point higher than a melting point of the melt.

3. A method of manufacturing a cooling device using a heat pipe, the method comprising:

a filling step in which a predetermined support member is filled inside a pipe to prevent deformation of the pipe by a pressure of a melt being injected into a cavity of a mold that is closeable;

a pipe seating step in which the pipe filled with the predetermined support member is seated in the cavity;

a melt injecting step in which the melt is injected into the cavity to surround the pipe;

a cooling and withdrawing step in which the injected melt is cooled and a molded product formed by the melt being cooled is withdrawn;

an injecting step in which a working fluid is injected into the pipe through an injection end formed at one end of the pipe; and a finishing step in which, after the injecting step, the pipe is sealed, wherein the pipe includes:
a first pipe that is meltable by the melt; and
a second pipe that has a hardness higher than a hardness of the predetermined support member.

4. The method according to claim 2, wherein the predetermined material is made of a water-soluble material.

5. The method according to claim 2, wherein the melt is made of a same material as a material of which the first pipe is made.

6. The method according to claim 3, wherein the predetermined material is made of a water-soluble material.

7. The method according to claim 3, wherein the melt is made of a same material as a material of which the first pipe is made.

* * * * *